(12) United States Patent
Yamashita

(10) Patent No.: US 7,906,032 B2
(45) Date of Patent: Mar. 15, 2011

(54) METHOD FOR CONDITIONING A PROCESS CHAMBER

(75) Inventor: Asao Yamashita, Fishkill, NY (US)

(73) Assignee: Tokyo Electron Limited, Tokyo (JP)

( * ) Notice: Subject to any disclaimer, the term of this patent is extended or adjusted under 35 U.S.C. 154(b) by 444 days.

(21) Appl. No.: 11/393,674

(22) Filed: Mar. 31, 2006

(65) Prior Publication Data

US 2007/0238199 A1    Oct. 11, 2007

(51) Int. Cl.
*H01L 21/00* (2006.01)
*C23C 16/00* (2006.01)
*C23C 14/00* (2006.01)

(52) U.S. Cl. .......... 216/67; 156/345.24; 438/5; 118/715; 134/1.2

(58) Field of Classification Search ............. 156/345.24, 156/345.25, 345.26, 345.27, 345.28; 118/712, 118/715; 700/121; 216/67; 438/5; 134/1.2
See application file for complete search history.

(56) References Cited

U.S. PATENT DOCUMENTS

| | | | |
|---|---|---|---|
| 6,322,716 B1* | 11/2001 | Qiao et al. | 216/67 |
| 6,656,848 B1* | 12/2003 | Scanlan et al. | 438/710 |
| 2003/0052083 A1* | 3/2003 | Kim et al. | 216/59 |
| 2003/0173333 A1* | 9/2003 | Wang et al. | 216/67 |
| 2005/0150866 A1* | 7/2005 | O'Donnell et al. | 216/67 |
| 2005/0221020 A1* | 10/2005 | Fukiage | 427/569 |
| 2005/0233477 A1* | 10/2005 | Yamazaki et al. | 438/5 |
| 2006/0000797 A1* | 1/2006 | Adams et al. | 216/37 |
| 2007/0054496 A1* | 3/2007 | Paduraru et al. | 438/725 |

* cited by examiner

*Primary Examiner* — Ram N. Kackar
(74) *Attorney, Agent, or Firm* — Oblon, Spivak, McClelland, Maier & Neustadt, L.L.P.

(57) ABSTRACT

A method of conditioning a processing chamber for a production process includes performing a conditioning step at a conditioning process recipe substantially different than a process recipe of the production process, and performing a warm-up process at a warm-up process recipe substantially the same as the process recipe of the production process. The method can be performed after a wet-cleaning process has been performed. The conditioning procedure can allow the maintenance time to be decreased and can cause the etched features to be more accurate.

10 Claims, 3 Drawing Sheets

METHOD FOR CONDITIONING A PROCESS CHAMBER

FIELD OF THE INVENTION

The present invention is related to wafer-to-wafer control methods in a semiconductor processing system, and particularly to a wafer-to-wafer control method for an etch process.

BACKGROUND OF THE INVENTION

A plasma processing apparatus having an upper electrode and a lower electrode provided to face opposite each other within an airtight processing chamber is widely employed in semiconductor device manufacturing processes in the related art. Such a plasma processing apparatus adopts a structure that enables a specific type of plasma processing to be executed on a substrate with plasma generated from a process gas supplied into the processing chamber by applying high-frequency power to the upper electrode after placing the substrate on the lower electrode.

Throughout the various stages of plasma processing, such as semiconductor or display manufacturing, etc., process parameters may vary. Processing conditions can change over time, with changes in process parameters creating undesirable results. Small changes can occur in the composition or pressure of an etch gas, process chamber conditions, or wafer temperature. Further, periodic maintenance of processing equipment may change process results. As such, plasma processing facilities require constant monitoring.

The measuring and monitoring of these process parameters at any given time permits valuable data to be accumulated and analyzed. Process control feedback may be used to adjust the process parameters or determine the viability of certain process materials. However, in many cases, changes in process data reflecting deterioration of processing characteristics cannot be detected by simply referring to the process data displayed. It is difficult to detect early stage abnormalities and characteristic deterioration of a process, and often it may be necessary to obtain fault detection and prediction, as well as pattern recognition by an advanced process control (APC). Oftentimes a processing tool is not connected to an APC system and the data on the processing tool is not adequately used.

SUMMARY OF THE INVENTION

The present invention includes a method of operating a semiconductor processing system that includes determining a first chamber state for a processing chamber, wherein the first chamber state occurs after a first amount of chamber processing time; and taking a processing chamber off-line when the first chamber state indicates a first chamber maintenance procedure is required, wherein the first chamber maintenance procedure includes a wet cleaning operation in which the processing chamber is not opened and is taken out of production for a first amount of time. Also included is determining a second chamber state for the processing chamber and performing a first chamber plasma conditioning procedure, wherein the first chamber conditioning procedure includes a coating operation in which the chamber is not opened and is taken out of production for a second amount of time. The method then includes putting the processing chamber back on-line.

Another aspect of the invention includes a method of conditioning a processing chamber for a production process. The method includes performing a conditioning step at a conditioning process recipe substantially different than a process recipe of the production process, and performing a warm-up process at a warm-up process recipe substantially the same as the process recipe of the production process.

DETAILED DESCRIPTION OF AN EMBODIMENT

The present invention provides a method and apparatus for controlling process parameters at the wafer-to-wafer level. By using closely integrated measurement devices, it is possible to provide real time measurements of the critical dimensions (CD) of the incoming material. For example, the process recipe can include a target CD indicating the desired critical dimension after the process is completed. The purpose of the run-to-run (R2R) controller is to provide a set of recipe parameters for each wafer that will achieve the desired results using wafer-to-wafer (W2W) control.

The relationship between the desired process results and the process parameters needed to achieve those results is called the process model. For example, in an etch tool, there can be a simple relationship between the amount of material that needs to be etched, the etch rate and the etch time.

The performance of any process tool is expected to drift over time, and the process model can include drift-related components. It is possible to correct for small deviations in the process model by measuring the actual process result and comparing it with the desired result. This difference can then be used to update the accuracy of the model.

In "real-world" applications of process control, disturbances and noise limit our ability to accurately control the process. These sources of noise and disturbances must be understood and reduced in order to achieve optimal results. For example, if the repeatability of the measurement of the bottom CD in a gate stack is one nanometer out of 40 nanometers total, this represents a relative error of 2.5%. If no correction were made for this measurement error, then we would expect the process result to vary by at least 2.5%.

In developing a R2R control strategy the following items can be considered: the selection of the observed parameters from the measurement devices; the selection of the controlled parameters in the recipe; the algorithm used to determine the values of controlled parameters based on the observed parameters; the definition of the range of each of the controlled parameters; the definition of the step size of each of the controlled parameters; the range of the process (how much trim can be performed); the precision of control of the controlled parameters, the accuracy of the controlled parameters; a methodology to eliminate noise in the observed parameters; and a methodology to update the process model if necessary.

Figure 1:
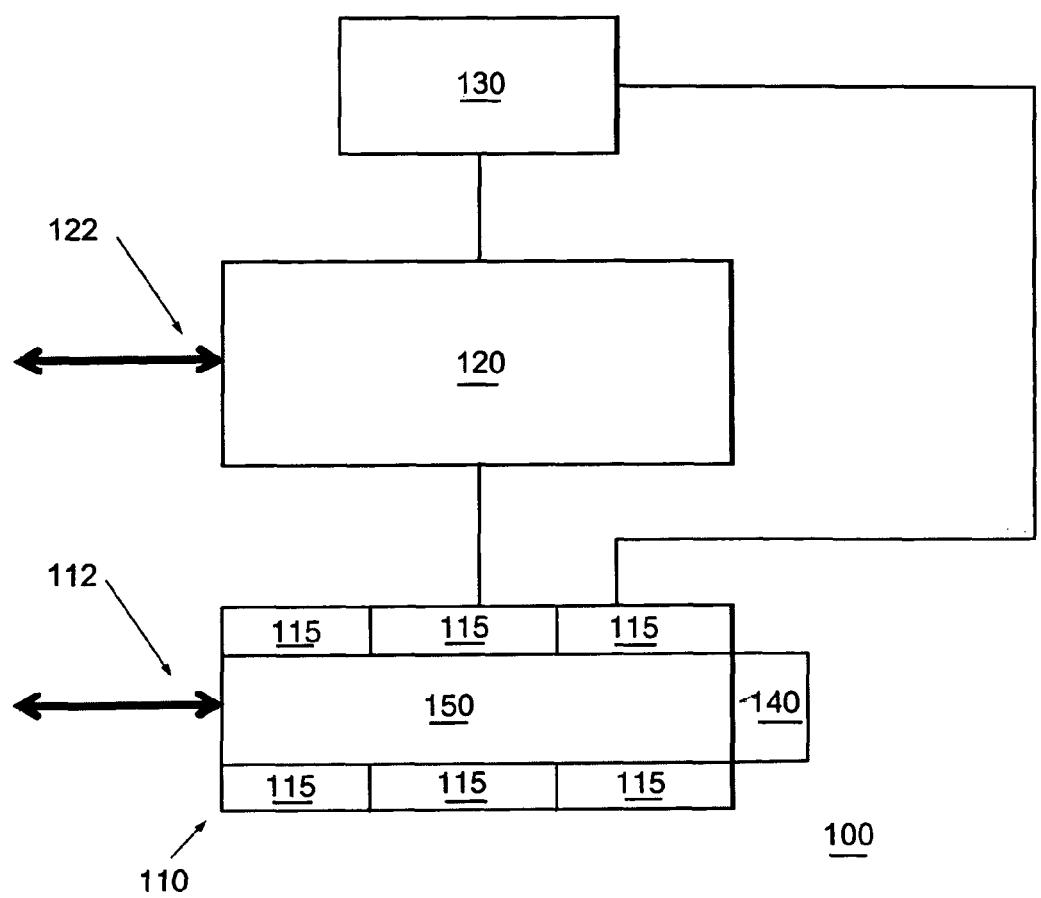
FIG. 1 shows an exemplary block diagram of a processing system in accordance with embodiments of the invention.

FIG. 1 shows an exemplary block diagram of a processing system in accordance with an embodiment of the present invention. In the illustrated embodiment, processing system 100 comprises a processing tool 110, a controller 120 coupled to the processing tool 110, and a manufacturing equipment system (MES) 130 coupled to the processing tool 110 and the controller 120. The processing tool 110 can include a number of processing modules 115 that can be coupled to a transfer system 150

In addition, an integrated metrology module (IMM) 140 can be coupled to the processing tool 110. For example, the IMM 140 can be coupled to the transfer system 150. Alternatively, the IMM 140 may be coupled to the processing tool 110 in a different manner. At least one of the processing tool 110, the controller 120, the MES 130, and the IMM 140 can comprise a control component, a GUI component, and/or a database component (not shown). In alternate embodiments, one or more of these components may not be required.

Some setup and/or configuration information can be obtained by the processing tool 110 and/or the controller 120 from a factory system. Factory level business rules can be used to establish a control hierarchy. Business rules can be used to specify the action taken for normal processing and the actions taken on error conditions. For example, the processing tool 110 and/or the controller 120 can operate independently, or can be controlled to some degree by the factory system. Also, factory level business rules can be used to determine when a process is paused and/or stopped, and what is done when a process is paused and/or stopped. In addition, factory level business rules can be used to determine when to change a process and how to change the process.

Business rules can be defined at a control strategy level, a control plan level or a control model level. Business rules can be assigned to execute whenever a particular context is encountered. When a matching context is encountered at a higher level as well as a lower level, the business rules associated with the higher level can be executed. GUI screens can be used for defining and maintaining the business rules. Business rule definition and assignment can be allowed for users with greater than normal security level. The business rules can be maintained in a database associated with the processing system 100. Documentation and help screens can be provided on how to define, assign, and maintain the business rules.

The MES 130 can be configured to monitor some system processes using data reported from databases associated with the processing tool 110 and/or the controller 120. Factory level business rules can be used to determine which processes are monitored and which data is used. For example, the processing tool 110 and/or the controller 120 can independently collect data, or the data collection process can be controlled to some degree by the factory system. Also, factory level business rules can be used to determine how to manage the data when a process is changed, paused, and/or stopped.

In addition, the MES 130 can provide run-time configuration information to the processing tool 110 and/or the controller 120. Data can be exchanged using GEM SECS communications protocol. For example, APC settings, targets, limits, rules, and algorithms can be downloaded from the factory to the processing tool 110 and/or the controller 120 as an "APC recipe", an "APC system rule", and "APC recipe parameters". Measurement system recipes and settings can be downloaded from the factory to the processing tool 110 and/or the controller 120 as an "IMM recipe", an "IMM system rule", a Profile Application Server (PAS) recipe, and/ or "IMM recipe parameters".

In general, rules allow system and/or tool operation to change based on the dynamic state of the processing system 100. Some setup and/or configuration information can be determined by the processing tool 110 and/or the controller 120 when they are initially configured by the processing system 100. In addition, tool level rules can be used to establish a control hierarchy at the tool level. For example, the processing tool 110 and/or the IMM 140 can operate independently, or the IMM 140 can be controlled to some degree by the processing tool 110. Also, tool level rules can be used to determine when a process is paused and/or stopped, and what is done when a process is paused and/or stopped. In addition, tool rules can be used to determine when to change a process, how to change the process, and how to manage the data.

In FIG. 1, one processing tool 110, and one controller 120 are shown, but this is not required for the invention. The semiconductor processing system can comprise any number of processing tools having any number of controllers associated with them in addition to independent process tools and modules.

The processing tool 110 and/or the controller 120 can be used to configure any number of processing tools having any number of processing tools associated with them in addition to any number of independent process tools and modules. Among other functions, the processing tool 110 and/or the controller 120 can collect, provide, process, store, and display data from processes involving processing tools, processing subsystems, process modules, and sensors.

The processing tool 110 and/or the controller 120 can comprise a number of applications including at least one tool-related application, at least one module-related application, at least one sensor-related application, at least one interface-related application, at least one database-related application, at least one GUI-related application, and at least one configuration application, among others.

The system 100 can comprise an APC system that can interface with processing tools from Tokyo Electron Limited (TEL), such as a Unity Tool, a Telius Tool and/or a Trias Tool and their associated processing subsystems and process modules. In addition, the system 100 can comprise one or more run-to-run (R2R) controllers. For example, the processing system 100 can include a TELIUS™ from Tokyo Electron Limited, and one or more controllers such as a group level controller (i.e. an INGENIO™ GL controller from Tokyo Electron Limited), a tool level controller (i.e. an INGENIO™ controller from Tokyo Electron Limited), and a measurement analysis controller (i.e. a Profiler™ Application Server (PAS) from Timbre Technologies, Inc a TEL company). In addition, the IMM 140 can be an iODP system from Timbre Technologies, Inc. Timbre Technologies, Inc is a California corporation and a wholly owned subsidiary of TEL.

Alternately, the controller 120 can support other process tools and other process modules.

A GUI component (not shown) can provide easy to use interfaces that enable users to: view tool status and process module status; create and edit x-y charts of summary and raw (trace) parametric data for selected wafers; view tool alarm logs; configure data collection plans that specify conditions for writing data to the database or to output files; input files to statistical process control (SPC) charting, modeling and spreadsheet programs; examine wafer processing information for specific wafers, and review data that is currently being saved to the database; create and edit SPC charts of process parameters, and set SPC alarms which generate e-mail warnings; run multivariate PCA and/or PLS models; and view diagnostics screens in order to troubleshoot and report problems with the TL controller 120. As should be apparent to those skilled in the art, the GUI component need not provide interfaces for all functions. Instead the GUI may provide interfaces for any subset of these functions or others not listed here.

Controller 120 can include a memory (not shown) that can include one or more databases. Data from the tool can be stored as files in a database. In addition, IM data and host metrology data can be stored in the database. The amount of data depends on the data collection plans that are configured, as well as the frequency with which processes are performed and processing tools are run. The data obtained from the processing tools, the processing chambers, the sensors, and the operating system can be stored in the database.

In an alternate embodiment, the system 100 can comprise a client workstation (not shown). The system 100 can support a plurality of client workstations. A client workstation can allow a user to perform configuration procedures; to view status including tool, controller, process, and factory status; to view current and historical data; to perform modeling and charting functions; and to input data to the controller. For example, a user may be provided with administrative rights that allow him to control one or more processes performed by a system component.

Processing tool 110 and the controller 120 can be coupled to MES 130 and can be part of a Fault Detection and Classification (FDC) System. The processing tool 110 and/or the controller 120 can exchange information with a factory system. In addition, the MES 130 can send command and/or override information to the processing tool 110 and/or the controller 120. For example, the MES 130 can feed-forward to the processing tool 110 and/or the controller 120 downloadable recipes for any number of process modules, tools, and measuring devices, with variable parameters for each recipe. Variable parameters can include final CD targets, limits, offsets, and variables in the tool level system that needs to be adjustable by lot. In addition, metrology data can be feed-forwarded to controller 120 from a factory system or a lithography tool, such as a Lithius tool from Tokyo Electron Limited.

Furthermore, the MES 130 can be used to provide measurement data, such as CD SEM information, to the controller 120. Alternately, the CD SEM information can be provided manually. Adjustment factors are used to adjust for any offset between the IM and CD SEM measurements. The measurement and/or historical data can include wafer identification information and a timestamp, such as a date, for proper insertion in to the database.

A single processing tool 110 is also shown in FIG. 1, but this is not required for the invention. As noted above, additional processing tools can be used. In one embodiment, a processing tool 110 can comprise one or more processing modules. Processing tool 110 can comprise at least one of an etch module, a deposition module, a measurement module, a polishing module, a coating module, a developing module, and a thermal treatment module.

Processing tool 110 can comprise link 112 for coupling to at least one other processing tool and/or controller. For example, other processing tools and/or controllers can be associated with a process that has been performed before this process, and/or other controllers can be associated with a process that is performed after this process. Link 112 can be used to feed forward and/or feed back information. For example, feed forward information can comprise data associated with an in-coming wafer. This data can include lot data, batch data, run data, composition data, and wafer history data.

The IMM 140 can include an Optical Digital Profiling (ODP) system. The processing tool 110 can also include module related measurement devices, tool-related measurement devices, and external measurement devices. For example, data can be obtained from sensors coupled to one or more process modules and sensors coupled to the processing tool. Sensors can include an Optical Emission Spectroscopy (OES) sensor and optical end point detection sensor. For example, the wavelength ranges for these sensors can range from 200 nm to 900 nm. In addition, data can be obtained from an external device such as a Scanning Electron Microscopy (SEM) tool, a Transmission Electron Microscopy (TEM) tool, and/or an Optical Digital Profiling (ODP) tool.

An ODP tool is available from Timbre Technologies Inc. (a TEL company), which provides a patented technique for measuring the profile of a structure in a semiconductor device. For example, ODP techniques can be used to obtain critical dimension (CD) information, structure profile information, or via profile information.

Controller 120 is coupled to processing tool 110 and MES 130, and information such as pre-processing data and post-processing data can be exchanged between them. For example, when an internal error event is generated by the tool, the controller 120 can send a message, containing information about the event, to the MES 130. This can allow the factory system and/or factory personnel to make the necessary changes to minimize the number of wafers at risk after a major change occurs such as those that occur during corrective or preventative maintenance.

A single controller 120 is also shown in FIG. 1, but this is not required for the invention. As noted above, additional controllers can be used. For example, the controller 120 can comprise at least one of a run-to-run (R2R) controller, a feed-forward (FF) controller, a process model controller, a feedback (FB) controller, and/or a process controller (all not shown in FIG. 1).

Controller 120 can comprise link 122 for coupling to at least one other controller. For example, other controllers can be associated with a process that has been performed before this process, and/or other controllers can be associated with a process that is performed after this process. Link 122 can be used to feed forward and/or feedback information.

In one case, the controller 120 knows the input state and a model equation for the desired state for the wafer, and the controller determines a set of recipes that can be performed on the wafer to change the wafer from the input state to a processed state. In another case, the controller 120 determines the input state and desired state for the wafer, and the controller 120 determines a set of recipes that can be performed on the wafer to change the wafer from the input state to the desired state. For example, the set of recipes can describe a multi-step process involving a set of process modules.

One time constant for the controller 120 can be based on the time between measurements. When measured data is available after a lot is completed, the controller's time constant can be based on the time between lots. When measured data is available after a wafer is completed, the controller's time constant can be based on the time between wafers. When measurement data is provided real-time during processing, the controller's time constant can be based on processing steps, within a wafer. When measured data is available while a wafer is being processed or after a wafer is completed or after the lot is completed, the controller 120 can have multiple time constants that can be based on the time between process steps, between wafers, and/or between lots.

One or more controllers 120 can be operating at any point in time. For example, one controller can be in an operating mode while a second controller can be in a monitoring mode. In addition, another controller can be operating in a simulation mode. A controller can comprise a single loop or multiple loops, and the loops can have different time constants. For example, loops can be dependent on wafer timing, lot timing, batch timing, chamber timing, tool timing, and/or factory timing.

The controller 120 can compute a predicted state for the wafer based on the input state, the process characteristics, and a process model. For example, a trim rate model can be used along with a processing time to compute a predicted trim amount. Alternately, an etch rate model can be used along with a processing time to compute an etch depth, and a deposition rate model can be used along with a processing time to compute a deposition thickness. In addition, models can include SPC charts, PLS models, PCA models, FDC models, and Multivariate Analysis (MVA) models.

The controller 120 can receive and utilize externally provided data for process parameter limits in a process module. For example, the controller GUI component provides a means for the manual input of the process parameter limits. In addition, a factory level controller can provide limits for process parameters for each process module.

The controller 120 can receive and execute models created by commercially available modeling software. For example, the controller can receive and execute models that were created by external applications and sent to the controller.

In one embodiment, controller 120 can be used to run FDC applications and can send and/or receive information concerning an alarm/fault condition. For example, the controller can send and receive FDC information to and from a factory level controller or a tool level controller. In addition, FDC information can be sent via the e-Diagnostics network, e-mail, or pager after the identification of an error condition. In an alternate embodiment, FDC applications can be run on different controllers.

The controller 120 can take various actions in response to an alarm/fault, depending on the nature of the alarm/fault. The actions taken on the alarm/fault can be based on the business rules established for the context specified by the system recipe, process recipe, module type, module identification number, load port number, cassette number, lot number, control job ID, process job ID, slot number and/or the type of metrology data. In one embodiment, the controller determines the actions to take. Alternatively, the controller may be instructed to take some specific actions by the FDC system.

The controller 120 can comprise a database component for archiving input and output data. For example, the controller can archive, among other things, received inputs, sent outputs, and actions taken by the controller in a searchable database. In addition, the controller 120 can comprise hardware and/or software for data backup and restoration. Also, the searchable database can include model information, configuration information, and historical information and the controller 120 can use a database component to backup and restore model information and model configuration information both historical and current. Furthermore, the searchable database can include damage-assessment information, such as wafer data and/or process data, configuration information, and historical information and the controller can use the database component to backup and restore the damage-assessment information and wafer information both historical and current.

The controller 120 can comprise a web-based user interface. For example, the controller 120 can comprise a web enabled GUI component for viewing the data in the database. The controller can comprise a security component that can provide for multiple levels of access depending on the permissions granted by a security administrator. The controller 120 also can comprise a set of default models that are provided at installation time and have the ability to reset to default conditions.

The controller has the capability of managing multiple process models that are executed at the same time and are subject to different sets of process recipe constraints. The controller can run in three different modes: simulation mode, test mode, and standard mode. A controller can operate in simulation mode in parallel with the actual process mode. In addition, FDC applications can be run in real-time and produce real-time damage-assessment results. Furthermore, FDC applications can be run in a simulation mode and produce predicted damage-assessment results.

When the processing system includes a host system and one or more semiconductor processing systems, the host system can operate as the master system and can control and/or monitor a major portion of the processing operations. The host system can create a process sequence, and can send the process sequence to the processing system. In one embodiment, the process sequence can comprise a sequence of measurement module visits and processing module visits. A process job (PJ) can be created for each measurement module visit and each processing module visit.

In addition, virtual measurements and/or damage-assessments can be made when a processing system controller executes in a simulation mode. The results from simulation mode executions can be stored and used to predict damage-assessment and/or potential fault conditions.

In one embodiment, the processing tool 110 can comprise means for performing a trimming procedure as described. Alternatively, the processing tool 110 may comprise at least one of an etch module, a deposition module, a polishing module, a coating module, a developing module, an ashing module, an oxidation module, and a thermal treatment module, among others.

Figure 2:
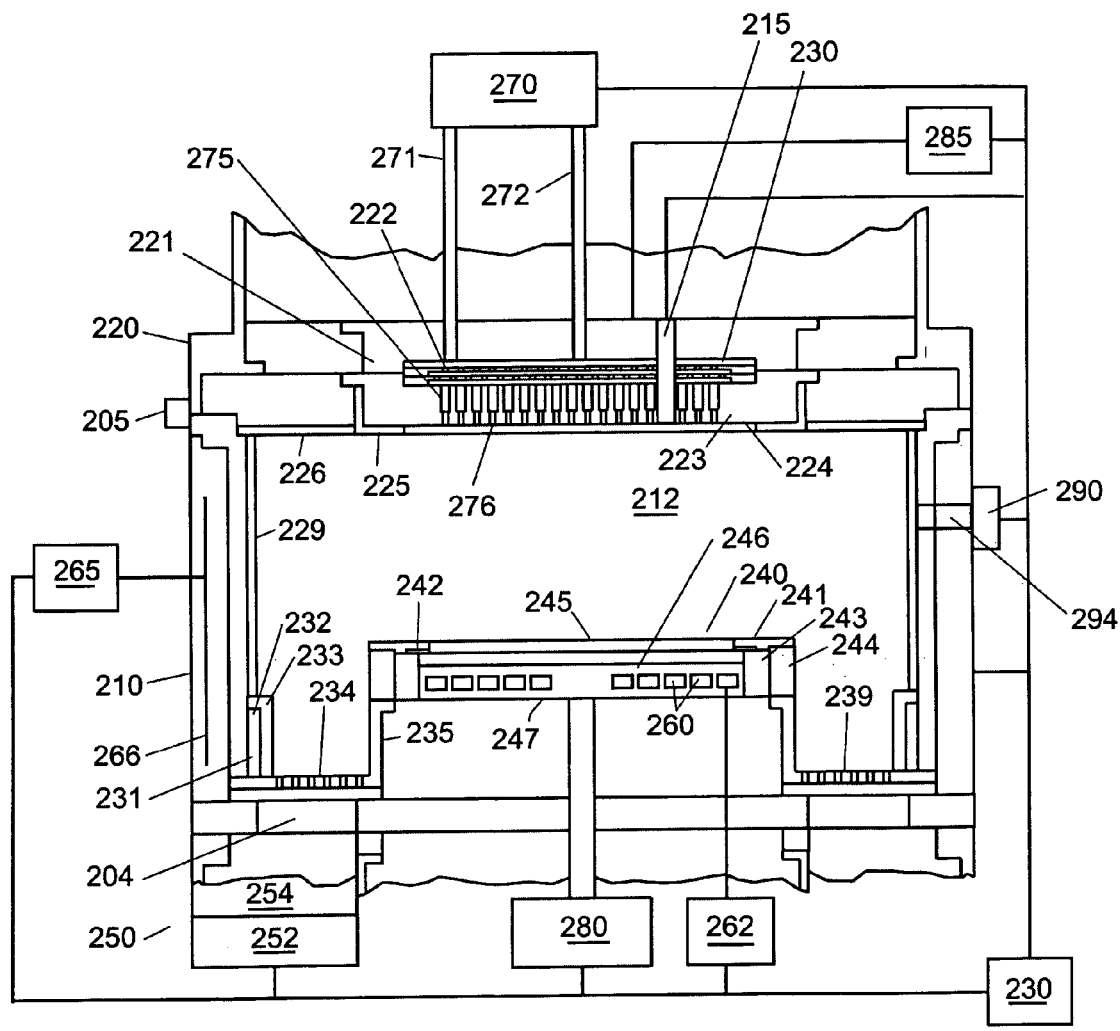
FIG. 2 shows an exemplary block diagram of a processing module in accordance with embodiments of the invention.

FIG. 2 illustrates an exemplary block diagram of a processing system according to an embodiment of the invention. For example, processing system 200 can comprise an etch system, such as a plasma etcher. Alternatively, processing system 200 can comprise a cleaning system, a developing system, a chemical treatment system, a thermal processing system, a coating system, a chemical vapor deposition (CVD) system, a physical vapor deposition (PVD, iPVD) system, an atomic layer deposition (ALD) system, and/or combinations thereof.

Processing system 200 can comprise elements for controlling the chamber wall temperature. As shown, a wall temperature control element 266 can be coupled to a wall temperature control unit 265, and the wall temperature control element 266 can be coupled to the processing chamber 210. The temperature control element can comprise a heater element, cooling element and/or sensing element. For example, the heater element can comprise a resistance heater or a carbon heater element. The temperature of the processing chamber 210 can be monitored using a temperature-sensing device such as a thermocouple (e.g. a K-type thermocouple, Pt sensor, etc.). Furthermore, a controller can utilize the temperature measurement as feedback to the wall temperature control unit 265 in order to control the temperature of the processing chamber 210.

In addition, the processing system 200 can further comprise a pressure control system 250 coupled to the processing chamber 210 to control the pressure in the processing chamber 210. The pressure control system 250 can comprise a vacuum pump 252 and a gate valve 254 for controlling the chamber pressure and a pressure sensor (not shown). For example, vacuum pump 252 can comprise a turbo-molecular vacuum pump (TMP) capable of a pumping speed up to 5000 liters per second (and greater). The TMP can be a Seiko STP-A803 vacuum pump, or an Ebara ET1301W vacuum pump. TMPs are useful for low pressure processing, typically less than 50 mTorr. For high pressure (i.e., greater than 100 mTorr) or low throughput processing (i.e., no gas flow), a mechanical booster pump and dry roughing pump can be used. Although the pressure control system 250 is shown coupled to the bottom of the processing chamber 210, this is not required. In alternate embodiments, pressure control system 250 can be coupled to the top, and/or side of the processing chamber 210. Furthermore, a controller can utilize a pressure measurement as feedback to the pressure control system 250 in order to control the chamber pressure.

For example, processing chamber 210 can facilitate the formation of processing plasma in a process space 212 adjacent to substrate 245. Alternately, processing chamber 210 can facilitate the formation of a processing gas in a process space 212 adjacent to substrate 245. The processing system 200 can be configured to process 200 mm substrates, 300 mm substrates, or larger substrates. In an alternate embodiment, processing system 200 can comprise multiple processing chambers, and the processing system can operate by generating plasma in one or more processing chambers.

Processing system 200 can further comprise an upper assembly 220 coupled to the processing chamber 210. For example, upper assembly 220 can comprise a gas distribution plate 275 that is coupled to a gas distribution system 270 for introducing a process gas into a process space 212 within the processing chamber 210. The gas distribution plate 275 can further comprise a plurality of orifices 276 configured to distribute one or more gasses from the gas distribution system 270 to the process space 212 of processing chamber 210. The process gas can comprise at least one of $NH_3$, HF, $H_2$, $O_2$, CO, $CO_2$, Ar, He, and $N_2$. For example, during a poly and/or nitride processes the process gas may comprise at least one of DCS, TCS, $SiH_4$, $Si_2H_6$, HCD, and $NH_3$; during a CVD Oxide process the process gas may comprise at least one of TEOS, and BTBAS; during an ALD process the process gas may comprise at least one of $H_2O$, TMA, HTB, NO, $N_2O$; and during a Metal CVD process the process gas may comprise at least one of Tungsten Carbonyl, Rhenium Carbonyl, and Taimata.

Furthermore, upper assembly 220 can be configured to perform at least one of the following functions: provide a capacitively coupled plasma (CCP) source, provide an inductively coupled plasma (ICP) source, provide a transformer-coupled plasma (TCP) source, provide a microwave powered plasma source, provide an electron cyclotron resonance (ECR) plasma source, provide a Helicon wave plasma source, and provide a surface wave plasma source.

For example, upper assembly 220 can comprise an upper electrode 230 and/or magnet system components (not shown). In addition, upper assembly 220 can comprise supply lines, injection devices, and/or other gas supply system components (not shown). Furthermore, upper assembly 220 can comprise a housing, a cover, sealing devices, and/or other mechanical components (not shown).

As shown in FIG. 2, processing system 200 can, for example, further comprise an inner depo shield 229, a shutter 231, an inner shutter 232, a bottom cover 233, an exhaust plate 234, and a lower wall cover 235. In some embodiments, the inner depo shield 229, the shutter 231, the inner shutter 232, the bottom cover 233, the exhaust plate 234, the lower wall cover 235, and/or the substrate holder 240 can comprise a protective barrier (not shown) formed on one or more exposed surfaces.

In addition, processing chamber 210 can comprise a monitoring device 215 connected to a monitoring port. For example, a monitoring port can permit optical monitoring of process space 212 and may be used for end point detection.

Substrate 245 can be, for example, transferred into and out of processing chamber 210 through opening 294 that is controlled by gate valve assembly 290. In addition, substrate 245 can be transferred on and off the substrate holder using a robotic substrate transfer system (not shown). In addition, substrate 245 can be received by substrate lift pins (not shown) housed within substrate holder 240 and mechanically translated by devices housed therein. Once substrate 245 is received from substrate transfer system, it can be lowered to an upper surface of substrate holder 240.

Substrate 245 can be affixed to the substrate holder 240 via an electrostatic clamping system, but passive wafer restraints may be also used. Moreover, gas can be delivered to the backside of substrate 245 via a backside gas system (not shown) to improve the gas-gap thermal conductance between substrate 245 and substrate holder 240. Such a system can be utilized when temperature control of the substrate is required at elevated or reduced temperatures. In other embodiments, heating elements, such as resistive heating elements, or thermoelectric heaters/coolers can be included.

In alternate embodiments, substrate holder 240 can, for example, further comprise a vertical translation device (not shown) that can be surrounded by a bellows (not shown) coupled to the substrate holder 240 and the processing chamber 210, and configured to seal the vertical translation device from the reduced pressure atmosphere in processing chamber 210. Additionally, a bellows shield (not shown) can be coupled to the substrate holder 240 and configured to protect the bellows.

As shown in FIG. 2, the substrate holder 240 can, for example, further include a focus ring 241, a focus ring base 242, an ESC enclosure 243, an insulator ring 244, an electrostatic chuck 246, and a lower electrode 247. The focus ring 241, the focus ring base 242, the ESC enclosure 243, and/or the insulator ring 244 can comprise a protective barrier (not shown) formed on one or more exposed surfaces. Alternatively, the substrate holder 240 may be configured differently.

Substrate holder 240 can comprise a lower electrode 247 through which RF power can be coupled to the process gasses in process space 212. For example, substrate holder 240 can be electrically biased at a RF voltage via the transmission of RF power from RF system 280. In some cases, a RF bias can be used to heat electrons to form and maintain plasma. A typical frequency for the RF bias can range from 1 MHz to 100 MHz. For example, semiconductor processing systems that use 13.56 MHz for plasma processing are well known to those skilled in the art.

Furthermore, substrate holder 240 can comprise temperature control elements 260 for controlling the temperature of the substrate 245. Control/power source 262 can provide signals and/or energy to the control elements 260, and the control unit can heat or cool the substrate holder 240 and the substrate 245.

In addition, in other embodiments, substrate holder 240 can comprise a protective barrier (not shown) formed on one or more exposed surfaces of the substrate holder 240.

Again referring to FIG. 2, the upper assembly 220 can include an upper electrode body 221, a top baffle assembly 222, a temperature control plate 223, an electrode cover 224, an inner shield ring 225, and an outer shield ring 226. The electrode cover 224, the inner shield ring 225, and the outer shield ring 226 can comprise a protective barrier (not shown) formed on one or more exposed surfaces. In alternate embodiments, a protective barrier (not shown) can be formed on one or more interior surfaces of the upper assembly 220.

In addition, processing system 200 can comprise a second RF system 285 that can be coupled to the upper electrode 221 and can be used to provide additional RF power to the process gasses in process space 212. For example, upper electrode 221 can be electrically biased at a RF voltage via the transmission of RF power from RF system 285. In some cases, this RF signal can be used to form and/or control plasma. A typical frequency for the second RF system can range from 1 MHz to 100 MHz. For example, semiconductor processing systems that use 60 MHz for plasma processing are well known to those skilled in the art.

Protective barriers, when used to protect components in processing system 200, can be created in a number of different ways. In one case, a protective barrier can be created by anodizing a metal, and impregnating the anodized surface with Teflon. For example, a protective barrier can be formed by hard anodizing aluminum or hard anodizing an aluminum alloy and impregnating the hard-anodized surface with TFE. In other cases, a protective barrier can be created using at least one of $Al_2O_3$, Yttria ($Y_2O_3$), $Sc_2O_3$, $Sc_2F_3$, $YF_3$, $La_2O_3$, $CeO_2$, $Eu_2O_3$, and $DyO_3$. In addition, a protective barrier can comprise at least one of an III-column element (column III of periodic table) and a Lanthanon element; the III-column element can comprise at least one of Yttrium, Scandium, and Lanthanum, and the Lanthanon element can comprise at least one of Cerium, Dysprosium, and Europium.

In addition, a protective barrier can be formed in the processing chamber as part of a pre-process coating, such as a SiN or Si deposition prior to the desired process film.

Processing system 200 can also comprise a controller 230. Controller 230 can be coupled to chamber 210, monitoring device 215, upper assembly 220, substrate holder 240, pressure control system 250, control source 262, temperature control unit 265, gas supply system (gas distribution system) 270, first RF source (RF power system) 280, second RF source 285, and gate valve 290. The controller can be configured to provide control data to the system components and receive process and/or status data from the system components. For example, controller 230 can comprise a microprocessor, a memory (e.g., volatile or non-volatile memory), and a digital I/O port capable of generating control voltages sufficient to communicate and activate inputs to the processing system 200 as well as monitor outputs from the processing system 200. Moreover, the controller 230 can exchange information with chamber 210, monitoring device 215, upper assembly 220, substrate holder 240, pressure control system 250, control source 262, temperature control unit 265, gas supply system 270, first RF source 280, second RF source 285, and gate valve 290. In addition, a program stored in the memory can be utilized to control the aforementioned components of a processing system 200 according to a process recipe. In addition, controller 230 can be configured to analyze the process and/or status data, to compare the process and/or status data with target process and/or status data, and to use the comparison to change a process and/or control a system component. In addition, the controller can be configured to analyze the process and/or status data, to compare the process and/or status data with historical process and/or status data, and to use the comparison to predict, prevent, and/or declare a fault.

As shown in FIG. 2, a processing module 200 can include an upper assembly 220 and a processing chamber 210 that can include a substantially cylindrical electrically conductive unit having an open top. The upper assembly 220 can be detachably fixed to the processing chamber assembly 210 by a locking mechanism 205, and thus, the processing chamber assembly 210 can be opened and/or closed freely. This facilitates the replacement components and/or the cleaning of the chamber.

A gas supply system 270 can be coupled to the upper assembly 220. In one embodiment, a two zone gas distribution configuration can be used. A first gas supply line 271 can be coupled to a first distribution zone (not shown), and a second gas supply line 272 can be coupled to a second distribution zone (not shown). For example, the first distribution zone can be located in a center portion of the chamber, and the second distribution zone can be located in a peripheral portion of the chamber. A plurality of gas outlet holes 276 are formed in the upper assembly 220 to provide a process gas into a plasma processing space 212. The outlet holes (orifices) 276 can be connected to a gas supply system 270 through the baffle 222. Thus, one or more different process gasses can be supplied from the gas supply source 270 at different rates into different zones of the plasma processing space 212 via the outlet holes 276.

In addition, an exhaust plate 234 can be provided around the bottom portion of the substrate holder 220. The exhaust plate 234 can be used to separate the plasma processing space 202 from an evacuation space 204, and the exhaust plate 234 can include a plurality of holes 239 formed in the exhaust plate 234. For example, the plurality of holes 239 may include a plurality of through holes and a plurality of blind holes (non-through holes). The plasma processing space 212 above the exhaust plate 234 and the evacuation space 204 below the exhaust plate 234 are allowed to communicate with each other through the through holes 239. Thus, the gas inside the plasma processing space 212 travels through the through holes 239 in the exhaust plate 234 and is then evacuated as necessary by the pressure control system 250.

The system of FIG. 2 can be used for etching a gate stack for a semiconductor device. Specifically, a gate stack may originate from a multilayer structure including a layer of undoped polysilicon, a layer of doped polysilicon, and an antireflective coating layer. This multilayer structure is then masked and etched to provide a gate stack structure having desired critical dimensions, such as a vertical height CD.

Over time, the repeated performance of this etching process leads to conditions within the process chamber that are undesirable for further performance of the etched process. For example, the etching process may lead to particle buildup on chamber components, which can break away to contaminate the substrate being processed. Thus, periodic cleaning of the process chamber should be performed.

However, the present inventors have recognized that such periodic cleaning of the chamber can shift critical dimension measurements of features formed by the process. In particular, the present inventors have observed that a wet cleaning of the process chamber can cause the vertical CD of a gate stack to be 4-6 nanometers smaller than desired. Further, this shift in critical dimension will drift down during production until the next wet cleaning. While the CD drift will eventually stabilize such that the process has repeatability suitable for production, the initial drift can result in out of tolerance wafers and wasted processing time for the system. The present inventors have performed extensive testing and analysis of the CD drift problem in an effort to improve process stability between chamber cleanings.

As a result of the testing and analysis, the present inventors discovered that the CD drift is a result of changes in voltage peak-to-peak ($V_{pp}$) on the upper electrode that effects etch rates between wet cleanings. For example, the present inventors determined that where $C_xF_y$ chemistry is used in a process chamber having quartz or anodized aluminum parts, F can attack the quartz or anodized part to form $AlF_x$ to coat the chamber parts. The $AlF_x$ which coats changes the capacitive reactance of certain chamber components, resulting in an imbalance in the RF plasma return path and a reduction in $V_{pp}$ on the upper electrode which can reduce the etching rate. Specifically, the present inventors have observed that upper electrode $V_{pp}$ and etch rate drift down during etching of ARC and doped polysilicon layers of a gate stack throughout initial process runs after wet cleaning due to $AlF_x$ buildup on the chamber components such paths deposition shields and ring covers of the system of FIG. 2.

Having discovered the source of the above identified problem, the present inventors determined that the CD drift problem may be solved by using chamber components with a protective coating such as a yttria coating to reduce the $AlF_x$ available for film formation in the chamber. However, this solution requires a hardware change, which is time consuming and relatively expensive to implement. Alternatively, the chamber can be "conditioned" by performing a "warm up" process at substantially the same recipe as the production process recipe, but with a non-production wafer until the CD drift has stabilized. However, this can require hundreds or thousands of conditioning wafers and about 50 RF hours of conditioning time, which is both expensive and time consuming.

Thus, the present inventors have developed a post-clean chamber conditioning process which avoids the need for expensive hardware changes and requires less non-production time than a conditioning process that uses warm up conditioning steps alone. Specifically, the present inventors have discovered that performing one or more conditioning process steps at a process recipe substantially different from the process recipe, in combination with a warm-up conditioning step using a process receipt substantially the same as a production process for which the chamber is being conditioned can reduce overall conditioning time. More specifically, performing one or more of a High Dope (HD) conditioning process, a wafer-less dry clean process (WLDC), and an oxygen dry clean process, in combination with a warm up substantially at the production process recipe can substantially reduce the overall conditioning time. As used herein, the term "substantially the same" and "substantially different" process recipe as the production process means using a process recipe that will provide process results that are within control limits or outside control limits of the production process respectively. In one embodiment, at least one of the conditioning processes is performed at a higher RF power than the production process recipe. The present inventors have discovered that conditioning the process chamber at a higher RF power can reduce the amount of time required for conditioning, resulting in greater productivity of the processing system.

When a HD conditioning process is performed, a bare silicon wafer can be positioned on a substrate holder in the processing chamber, and the processing chamber pressure can be established between approximately 10 mTorr and approximately 30 mTorr. The term "HD conditioning" is used because this conditioning process uses at least some of the same process gasses that are used for etching the high dope polysilicon layer, although the conditioning recipe is substantially different than the process recipe. In one example, the primary difference between the HD conditioning recipe and the HD production etch recipe is that the conditioning recipe includes a higher power to accelerate growth of $AlF_x$ on chamber components to condition the chamber. For example, a first RF power during the HD conditioning step can be provided to an upper electrode in the processing chamber, and the first RF power can be between approximately 500 Watts and approximately 1200 Watts. In addition, a second RF power can be provided to the substrate holder in the processing chamber, and the second RF power can be between approximately 10 Watts and approximately 500 Watts;

Process gases can also be provided. A first processing gas can be flowed into the processing chamber at a first flow rate, where the first processing gas can include $CF_4$ and the first flow rate ranges between approximately 10 sccm and approximately 100 sccm; a second processing gas can be flowed into the processing chamber at a second flow rate, where the second processing gas comprises $C_4F_8$ and the second flow rate ranges between approximately 2 sccm and approximately 25 sccm; and a third processing gas can be flowed into the processing chamber at a third flow rate, where the third processing gas comprises $N_2$ and the third flow rate ranges between approximately 10 sccm and approximately 100 sccm;

In addition, a first temperature can be established for the wafer, and the first temperature can range between approximately 50 degrees C. and approximately 70 degrees C.; and the bare silicon wafer can be etched for a first period of time that ranges from approximately 2 minutes to approximately 40 minutes. This HD conditioning step along with warm-up step can reduce the overall conditioning time from that of a warm-up conditioning alone. Further, the HD conditioning can be repeated using a plurality of wafers and/or can be performed in combination with other conditioning steps, as will be discussed below.

When the WLDC process is performed, a wafer is not positioned on a substrate holder in the processing chamber. This process is preferably performed when a conditioning wafer is removed after a bare wafer conditioning step such as the HD conditioning step discussed above or the $O_2$ dry cleaning or warm-up to be discussed below. However, the WLDC step can be performed alone with the warm-up step.

A processing chamber pressure can be established that is between approximately 50 mTorr and approximately 200 mTorr. A first RF power can be provided to an upper electrode in the processing chamber, and the first RF power can vary between approximately 500 Watts and approximately 2500 Watts; and a second RF power can be provided to the substrate holder in the processing chamber, and the second RF power can vary from approximately 0 Watts to approximately 100 Watts.

Process gases can also be provided. A first processing gas can be flowed into the processing chamber at a first flow rate, where the first processing gas can include $O_2$ and the first flow rate can range between approximately 50 sccm and approximately 200 sccm; a second processing gas can be flowed into the processing chamber at a second flow rate, where the second processing gas can include $SF_6$ and the second flow rate can range between approximately 100 sccm and approximately 400 sccm.

Furthermore, a first temperature can be established for the wafer that can range between approximately 50 degrees C. and approximately 70 degrees C.; and the bare silicon wafer can be etched for a first period of time that can range from approximately 5 seconds to approximately 60 seconds. This WLDC conditioning step along with warm-up step can reduce the overall conditioning time from that of warm-up conditioning alone. Further, the WLDC step can be repeated and/or performed in combination with other conditioning steps.

When the dry cleaning process is performed, a bare silicon wafer can be positioned on a substrate holder in the processing chamber; and a processing chamber pressure can be established that can be between approximately 10 mTorr and approximately 30 mTorr.

In addition, a first RF power can be provided to an upper electrode in the processing chamber, where the first RF power can be between approximately 300 Watts and approximately 1200 Watts; and a second RF power can be provided to the substrate holder in the processing chamber, where the second RF power can vary from approximately 0 Watts to approximately 100 Watts.

Process gases can also be provided. A first processing gas can be flowed into the processing chamber at a first flow rate; the first processing gas can include $O_2$, and the first flow rate can range between approximately 100 sccm and approximately 400 sccm;

Furthermore, a first temperature can be established for the wafer, where the first temperature can range between approximately 50 degrees C. and approximately 70 degrees C.; and the bare silicon wafer can be etched for a first period of time that can range from approximately 2 minutes to approximately 10 minutes. This dry cleaning step along with an abbreviated warm-up step can reduce the conditioning time from that of warm-up conditioning alone. Further, the dry cleaning step can be repeated using a plurality of wafers and/or in combination with other conditioning steps.

Different warm-up steps can be used, individually or in combination, with one or more of the above-described conditioning steps. Since the warm-up step is generally performed on a bare wafer using the same recipe as the subsequent process to be performed, the warm-up recipe depends on the subsequent process. Further, plural wafers can be used for the warm-up process. When a first warm-up process is performed, a bare silicon wafer can be positioned on a substrate holder in the processing chamber; and a processing chamber pressure can be established between approximately 5 mTorr and approximately 20 mTorr.

In addition, a first RF power can be provided to an upper electrode in the processing chamber, where the first RF power can vary between approximately 100 Watts and approximately 500 Watts; and a second RF power can be provided to the substrate holder in the processing chamber, where the second RF power can vary between approximately 25 Watts and approximately 150 Watts.

Process gases can also be provided. A first processing gas can be flowed into the processing chamber at a first flow rate, where the first processing gas can include $CF_4$ and the first flow rate can range between approximately 35 sccm and approximately 140 sccm; a second processing gas can be flowed into the processing chamber at a second flow rate, where the second processing gas comprises $O_2$ and the second flow rate can range between approximately 3 sccm and approximately 15 sccm; and a third processing gas can be flowed into the processing chamber at a third flow rate, where the third processing gas comprises $CH_2F_2$ and the third flow rate ranges between approximately 3 sccm and approximately 12 sccm.

Furthermore, a first temperature can be established for the wafer that can range between approximately 50 degrees C. and approximately 70 degrees C.; and the bare silicon wafer can be processed for a first period of time that can range from approximately 10 seconds to approximately 60 seconds.

When a second warm-up process is performed, a bare silicon wafer can be positioned on a substrate holder in the processing chamber; and a processing chamber pressure can be established that can vary between approximately 10 mTorr and approximately 40 mTorr.

In addition, a first RF power can be provided to an upper electrode in the processing chamber, where the first RF power is between approximately 400 Watts and approximately 1200 Watts; and a second RF power can be provided to the substrate holder in the processing chamber, where the second RF power can vary between approximately 100 Watts and approximately 400 Watts.

Process gases can also be provided. A first processing gas can be introduced into the processing chamber at a first flow rate; the first processing gas can include $CF_4$ and the first flow rate can range between approximately 25 sccm and approximately 100 sccm; a second processing gas can be flowed into the processing chamber at a second flow rate, where the second processing gas can include $C_4F_8$ and the second flow rate can range between approximately 6 sccm and approximately 25 sccm; and a third processing gas can be flowed into the processing chamber at a third flow rate, where the third processing gas can include $N_2$ and the third flow rate can range between approximately 25 sccm and approximately 100 sccm.

Furthermore, a first temperature can be established for the wafer that can range between approximately 50 degrees C. and approximately 70 degrees C.; and the bare silicon wafer can be processed for a first period of time that can range from approximately 10 seconds to approximately 60 seconds.

When a third warm-up process is performed, a bare silicon wafer can be positioned on a substrate holder in the processing chamber; and a processing chamber pressure can be established that can be between approximately 10 mTorr and approximately 40 mTorr.

In addition, a first RF power can be provided to an upper electrode in the processing chamber, where the first RF power can be between approximately 100 Watts and approximately 400 Watts; and a second RF power can be provided to the substrate holder in the processing chamber, where the second RF power is between approximately 50 Watts and approximately 200 Watts.

Process gases can also be provided. A first processing gas can be flowed into the processing chamber at a first flow rate, where the first processing gas can include HBr and the first flow rate can range between approximately 250 sccm and approximately 1000 sccm; and a second processing gas can be flowed into the processing chamber at a second flow rate, where the second processing gas can include $O_2$ and the second flow rate can range from approximately 0 sccm to approximately 5 sccm.

Furthermore, a first temperature can be established for the wafer that can range between approximately 50 degrees C. and approximately 70 degrees C.; and the bare silicon wafer can be processed for a first period of time that can range from approximately 10 seconds to approximately 60 seconds.

In a preferred embodiment of the invention, a combination of the conditioning steps discussed above can be used. An exemplary set of process recipes is shown in Table 1.

TABLE 1

| Step | Wafer | Press. (mT) | Power T/B (W) | CF4 | C4F8 | N2 | HBr (SCCM) | O2 | CH2F2 | SF6 | B.P. (C/E) (Torr) | Temp. T/W/B (deg. C.) | Etching Time | Cycle |
|---|---|---|---|---|---|---|---|---|---|---|---|---|---|---|
| HD Conditioning | Bare-Si | 20 | 800/200 | 50 | 13 | 50 | | | | | 3/50 | 80/60/75 | 20 min | 15 wafers |
| WLDC | | 100 | 1500/0 | | | | | 100 | | 200 | — | 80/60/75 | 30 sec | |
| O2 Dry Clean | Bare Si | 20 | 650/0 | | | | | 200 | | | 3/3 | 80/60/75 | 5 min | 1 wafer |
| Warm Up | Bare Si | 10 | 250/75 | 70 | | | | 7.5 | 6 | | 3/3 | 80/60/75 | 30 sec | 2 wafers |
| | | 20 | 800/180 | 50 | 13 | 50 | | | | | 3/3 | 80/60/75 | 30 sec | |
| | | 20 | 200/100 | | | | 450 | 1.7 | | | 3/3 | 80/60/75 | 30 sec | |

As seen in Table 1, a preferred conditioning process first includes an HD conditioning step on a bare silicon wafer for approximately 20 minutes at the process recipe shown. The bare wafer is then removed and a new bare wafer is prepared for another HD conditioning step. When the chamber is empty during preparation of the subsequent conditioning wafer, a WLDC step is performed for approximately 30 seconds at the process recipe shown. The HD conditioning step and the WLDC cycle is performed on 15 wafers as seen in Table 1. Upon completion of these 15 wafers, an $O_2$ dry clean step is performed on a bare silicon wafer for approximately five minutes at the recipe shown.

Finally, one of three warm-up steps shown in Table 1 is performed on a bare silicon wafer. As noted above, the warm up step is chosen based on the subsequent production process recipe that the chamber is being conditioned for. For example, the production process recipe can vary for etching different patterns, different poly silicon materials, different line widths, different mask materials etc. While only 3 warm up steps are shown in Table 1 above, it is to be understood that the warm up step is selected to be substantially the same process recipe as that of the subsequent process step, as discussed above. As seen in table 1, the selected warm up step is then repeated for a second wafer.

The present inventors have discovered that the above process shown in Table 1 can provide a chamber conditioning that substantially stabilizes the CD measurements in only approximately five hours. However, different combinations of the conditioning steps shown in Table 1 can be used to provide various time savings over the approximately 50 hour conditioning time required for warm up conditioning alone.

In some cases, when a conditioning procedure is performed the HD conditioning processing and the WLDC processing can use a minimum of ten wafers; the dry cleaning processing can use at least one wafer; and the warm-up processes can use at least two wafers.

Figure 3:
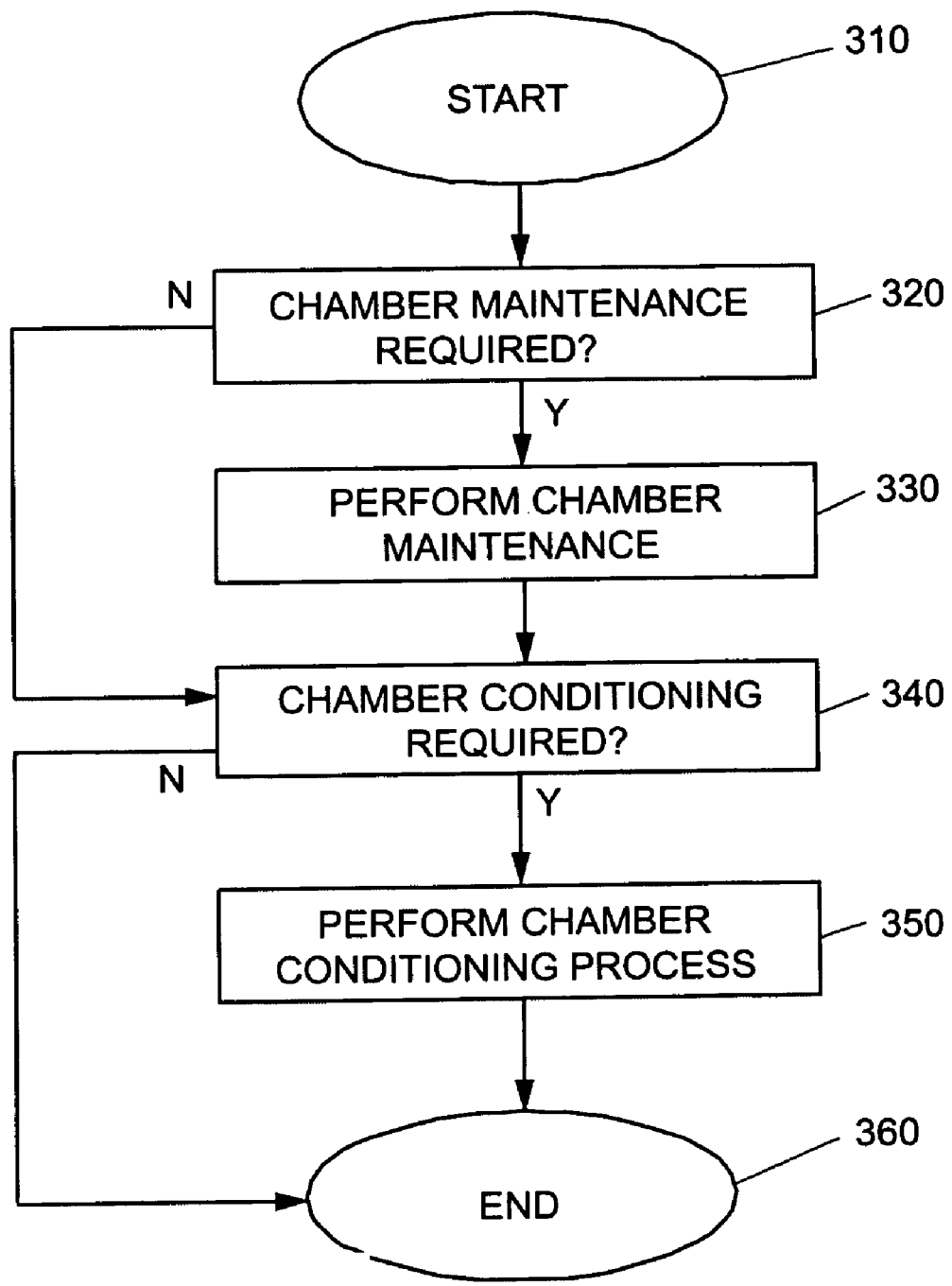
FIG. 3 illustrates a flow diagram for a method of operating a processing system in accordance with embodiments of the invention.

FIG. 3 illustrates a flow diagram for a method of operating a R2R controller in accordance with an embodiment of the present invention. Procedure 300 starts at 310. For example, the R2R controller can be coupled to at least one processing tool that can comprise at least one processing module, and at least one measuring device. For example, the R2R controller can be provided by Tokyo Electron, and the processing tool can include a cluster tool, such as one from Tokyo Electron. Also, the R2R controller can comprise a computer including operational software, a database coupled to the R2R controller, and a GUI coupled to the R2R controller. The operational software can associate an APC recipe with a control job, and sub recipes may be provided within the APC recipe. The APC recipe and sub recipes follow the SEMI formatted recipe standard. The formatted recipes are compatible with the factory system's recipe editor.

One method of operating a semiconductor processing system includes determining a first chamber state for a processing chamber, wherein the first chamber state occurs after a first amount of processing time. For example, the first chamber state may occur after a predetermined number of RF operation hours which indicates a dirty process chamber. Alternatively, the first chamber state, such as a dirty chamber, can be determined by chamber monitoring techniques further discussed below.

In various embodiments, the processing chamber can include an etching chamber, a deposition chamber, a cleaning chamber, a developing chamber, a chemical treatment chamber, or a thermal processing chamber, or a combination thereof.

In 320, a query can be performed to determine when a chamber maintenance procedure is required. When a chamber maintenance procedure is required, procedure 300 can branch to 330, and when a chamber maintenance procedure is not required procedure 300 can branch to 340.

In 330, a chamber maintenance procedure can be performed. In one embodiment, a processing chamber can be taken off-line when a first chamber state indicates that a first chamber maintenance procedure is required. Alternatively, a processing chamber may be put into an idle mode during a first chamber maintenance procedure. In one embodiment, the first chamber maintenance procedure can include a cleaning operation in which the processing chamber is not opened and is taken off-line for a first amount of time. For example, a chamber wet-cleaning process can be performed. In other embodiments, a processing chamber may be opened; the chamber may be cleaned; and one or more chamber components may be cleaned and/or replaced. The chamber state can be used to determine the type of cleaning steps to perform and the cleaning recipes. The cleaning procedure can change the state from the first chamber state to a "cleaned" chamber state.

In 340, a query can be performed to determine when a chamber conditioning procedure is required. When a chamber conditioning procedure is required, procedure 300 can branch to 350, and when a chamber conditioning procedure is not required procedure 300 can branch to 360.

In one embodiment, a second chamber state is determined for the processing chamber. The second chamber state can be used to determine if a chamber conditioning procedure is required. In addition, when a conditioning procedure is required, the second chamber state can be used to determine the steps and recipes to use during the conditioning.

In 350, a chamber conditioning procedure can be performed. The chamber conditioning procedure can include a multi-step procedure, and the chamber conditioning procedure can comprise a deposition operation in which one or more components in the chamber are conditioned/coated. During a chamber conditioning procedure, the chamber can remain closed and is taken off-line (out of production) for a second amount of time. The chamber conditioning procedure of the present invention minimizes the second amount of time and relative to the long processes previously used.

The chamber state can be used to determine the conditioning procedure that is required to change the state of the processing chamber from the "cleaned" chamber state to the second chamber state. When the conditioning procedure is performed on the processing chamber, the state of the chamber can change from the cleaned chamber state to a second chamber state (conditioned state). When the chamber state is not the second chamber state after a conditioning step has been performed, additional conditioning steps can be performed on the processing chamber.

The method for determining a chamber state can include measuring an optical property of the processing chamber, an electrical property of the processing chamber, or a physical property of the processing chamber, or a combination of two or more thereof. In addition, the method for determining the chamber state can include processing optical data from the processing chamber, processing electrical data from the processing chamber, processing physical data from the processing chamber, or historical data, or a combination of two or more thereof. For example, the first chamber state can be determined using a measured voltage, such as the voltage measured on a substrate holder. In another example, the first chamber state can be determined using time data, such as RF hours data.

In some embodiments, the method for determining the chamber state can include predicting a chamber state using a processing chamber model based on process conditions and/or processing times. In addition, the method can include determining differences between the predicted chamber state and the second chamber state; and using the differences to refine the model and/or conditioning procedure.

Procedure 300 can end in 360.

Numerous modifications and variations of the present invention are possible in light of the above teachings. It is therefore to be understood that, within the scope of the appended claims, the invention may be practiced otherwise than as specifically described herein.

What is claimed:

1. A method of conditioning a processing chamber for a production process, the method comprising:
    a first process including:
    transferring a new bare silicon wafer into the process chamber,
    performing a conditioning step for a predetermined time at a conditioning process recipe substantially different than a process recipe of the production process, wherein said substantially different process recipe is a process recipe that will provide process results that are outside control limits of the production process, including providing a first RF power to an upper electrode in the processing chamber, wherein the first RF power is between approximately 500 Watts and approximately 1200 Watts and the first RF power is higher than an RF power used in the production process,
    removing the bare silicon wafer from the process chamber; and
    performing a wafer-less dry cleaning step at a predetermined recipe for a predetermined time;
    repeating the first process at least ten times;
    transferring another new bare silicon wafer into the process chamber, performing an $O_2$ dry cleaning step at a predetermined recipe, and removing the bare silicon wafer from the process chamber at the end of the $O_2$ dry cleaning step;
    transferring another new bare silicon wafer into the process chamber and performing a warm-up process, which is a process that uses a warm-up process recipe which is substantially the same as the process recipe of the production process, removing the bare silicon wafer after the warm-up process, and repeating the warp-up process on another new bare silicon wafer.

2. The method as claimed in claim 1, wherein the conditioning step includes a conditioning process comprising:
    positioning a bare silicon wafer on a substrate holder in the processing chamber;
    establishing a processing chamber pressure between approximately 10 mTorr and approximately 30 mTorr;
    providing a second RF power to the substrate holder in the processing chamber, wherein the second RF power is between approximately 10 Watts and approximately 500 Watts;
    flowing a first processing gas into the processing chamber at a first flow rate, wherein the first processing gas comprises $CF_4$ and the first flow rate ranges between approximately 10 sccm and approximately 100 sccm;
    flowing a second processing gas into the processing chamber at a second flow rate, wherein the second processing gas comprises $C_4F_8$ and the second flow rate ranges between approximately 2 sccm and approximately 25 sccm;
    flowing a third processing gas into the processing chamber at a third flow rate, wherein the third processing gas comprises $N_2$ and the third flow rate ranges between approximately 10 sccm and approximately 100 sccm;
    establishing a first temperature for the wafer, wherein the first temperature ranges between approximately 50 degrees C. and approximately 70 degrees C.; and
    etching the bare silicon wafer for a first period of time, wherein the first period of time ranges from approximately 2 minutes to approximately 40 minutes.

3. The method as claimed in claim 1, wherein the wafer-less dry cleaning step comprising:
    establishing a processing chamber pressure between approximately 50 mTorr and approximately 200 mTorr;
    providing a first RF power to an upper electrode in the processing chamber, wherein the first RF power is between approximately 500 Watts and approximately 2500 Watts;
    providing a second RF power to the substrate holder in the processing chamber, wherein the second RF power varies from approximately 0 Watts to approximately 100 Watts;
    flowing a first processing gas into the processing chamber at a first flow rate, wherein the first processing gas comprises $O_2$ and the first flow rate ranges between approximately 50 sccm and approximately 200 sccm;
    flowing a second processing gas into the processing chamber at a second flow rate, wherein the second processing gas comprises $SF_6$ and the second flow rate ranges between approximately 100 sccm and approximately 400 sccm; and
    establishing a first temperature for the wafer, wherein the first temperature ranges between approximately 50 degrees C. and approximately 70 degrees C.

4. The method as claimed in claim 1, wherein the conditioning step includes a dry cleaning process comprising:
    positioning a bare silicon wafer on a substrate holder in the processing chamber;
    establishing a processing chamber pressure between approximately 10 mTorr and approximately 30 mTorr;

providing a first RF power to an upper electrode in the processing chamber, wherein the first RF power is between approximately 300 Watts and approximately 1200 Watts;

providing a second RF power to the substrate holder in the processing chamber, wherein the second RF power varies from approximately 0 Watts to approximately 100 Watts;

flowing a first processing gas into the processing chamber at a first flow rate, wherein the first processing gas comprises $O_2$ and the first flow rate ranges between approximately 100 sccm and approximately 400 sccm;

establishing a first temperature for the wafer, wherein the first temperature ranges between approximately 50 degrees C. and approximately 70 degrees C.; and etching the bare silicon wafer for a first period of time, wherein the first period of time ranges from approximately 2 minutes to approximately 10 minutes.

5. The method as claimed in claim 1, wherein the warm-up process comprises:

positioning a bare silicon wafer on a substrate holder in the processing chamber;

establishing a processing chamber pressure between approximately 5 mTorr and approximately 20 mTorr;

providing a first RF power to an upper electrode in the processing chamber, wherein the first RF power is between approximately 100 Watts and approximately 500 Watts;

providing a second RF power to the substrate holder in the processing chamber, wherein the second RF power is between approximately 25 Watts and approximately 150 Watts;

flowing a first processing gas into the processing chamber at a first flow rate, wherein the first processing gas comprises $CF_4$ and the first flow rate ranges between approximately 35 sccm and approximately 140 sccm;

flowing a second processing gas into the processing chamber at a second flow rate, wherein the second processing gas comprises $O_2$ and the second flow rate ranges between approximately 3 sccm and approximately 15 sccm;

flowing a third processing gas into the processing chamber at a third flow rate, wherein the third processing gas comprises $CH_2F_2$ and the third flow rate ranges between approximately 3 sccm and approximately 12 sccm;

establishing a first temperature for the wafer, wherein the first temperature ranges between approximately 50 degrees C. and approximately 70 degrees C.; and etching the bare silicon wafer for a first period of time, wherein the first period of time ranges from approximately 10 seconds to approximately 60 seconds.

6. The method as claimed in claim 1, wherein the warm-up process comprises:

positioning a bare silicon wafer on a substrate holder in the processing chamber;

establishing a processing chamber pressure between approximately 10 mTorr and approximately 40 mTorr;

providing a first RF power to an upper electrode in the processing chamber, wherein the first RF power is between approximately 400 Watts and approximately 1200 Watts;

providing a second RF power to the substrate holder in the processing chamber, wherein the second RF power is between approximately 100 Watts and approximately 400 Watts;

flowing a first processing gas into the processing chamber at a first flow rate, wherein the first processing gas comprises $CF_4$ and the first flow rate ranges between approximately 25 sccm and approximately 100 sccm;

flowing a second processing gas into the processing chamber at a second flow rate, wherein the second processing gas comprises $C_4F_8$ and the second flow rate ranges between approximately 6 sccm and approximately 25 sccm;

flowing a third processing gas into the processing chamber at a third flow rate, wherein the third processing gas comprises $N_2$ and the third flow rate ranges between approximately 25 sccm and approximately 100 sccm;

establishing a first temperature for the wafer, wherein the first temperature ranges between approximately 50 degrees C. and approximately 70 degrees C.; and etching the bare silicon wafer for a first period of time, wherein the first period of time ranges from approximately 10 seconds to approximately 60 seconds.

7. The method as claimed in claim 1, wherein the warm-up process comprises:

positioning a bare silicon wafer on a substrate holder in the processing chamber;

establishing a processing chamber pressure between approximately 10 mTorr and approximately 40 mTorr;

providing a first RF power to an upper electrode in the processing chamber, wherein the first RF power is between approximately 100 Watts and approximately 400 Watts;

providing a second RF power to the substrate holder in the processing chamber, wherein the second RF power is between approximately 50 Watts and approximately 200 Watts;

flowing a first processing gas into the processing chamber at a first flow rate, wherein the first processing gas comprises HBr and the first flow rate ranges between approximately 250 sccm and approximately 1000 sccm;

flowing a second processing gas into the processing chamber at a second flow rate, wherein the second processing gas comprises $O_2$ and the second flow rate ranges from approximately 0 sccm to approximately 5 sccm;

establishing a first temperature for the wafer, wherein the first temperature ranges between approximately 50 degrees C. and approximately 70 degrees C.; and etching the bare silicon wafer for a first period of time, wherein the first period of time ranges from approximately 10 seconds to approximately 60 seconds.

8. The method as claimed in claim 1, wherein the conditioning step comprises:

performing a high dope conditioning step using approximately 800 Watts of top electrode power and approximately 200 Watts of bottom electrode power;

performing the wafer-less dry cleaning step using approximately 1500 Watts top electrode power and approximately 0 Watts of bottom electrode power;

performing the dry clean step using approximately 650 Watts top electrode power and approximately 0 Watts of bottom electrode power.

9. The method of claim 8, wherein the method of conditioning is completed within approximately 5 hours.

10. The method of claim 8 wherein said method of conditioning is performed after a wet cleaning of the processing chamber.

* * * * *